United States Patent [19]
Esser et al.

[11] Patent Number: 5,677,010
[45] Date of Patent: Oct. 14, 1997

[54] METHOD FOR PRODUCING A POLYMER COATING INSIDE HOLLOW PLASTIC ARTICLES

[75] Inventors: Klaus Esser, Königswinter; Ulrich Karsch, Niederkassel; Jürgen Runkel, Bonn; Heinrich Grünwald, Gomaringen; Klaus Nauenburg, Tübingen, all of Germany; Jürgen Weichart, Balzers, Liechtenstein; Christoph Diener, Nagold, Germany

[73] Assignee: Kautex Werke Reinold Hagen Aktiengesellschaft, Bonn, Germany

[21] Appl. No.: 553,614

[22] PCT Filed: May 31, 1994

[86] PCT No.: PCT/DE94/00622

§ 371 Date: Jun. 17, 1996

§ 102(e) Date: Jun. 17, 1996

[87] PCT Pub. No.: WO94/27745

PCT Pub. Date: Dec. 8, 1994

[30] Foreign Application Priority Data

Jun. 1, 1993 [DE] Germany ............... 43 18 084.1
Jun. 1, 1993 [DE] Germany ............... 43 18 086.8

[51] Int. Cl.⁶ .................................................. C08J 7/18
[52] U.S. Cl. .................. 427/489; 427/237; 427/238; 427/255.2; 427/255.6; 427/295; 427/296; 427/488; 427/491; 427/493; 427/571; 427/574; 427/575; 427/578
[58] Field of Search .................. 427/237, 238, 427/491, 569, 296, 536, 575, 488, 489, 493, 571, 574, 578, 295, 255.2, 255.6

[56] References Cited

U.S. PATENT DOCUMENTS

| | | | |
|---|---|---|---|
| 4,536,271 | 8/1985 | Collins | 204/192 E |
| 4,656,083 | 4/1987 | Hoffman et al. | 428/265 |

FOREIGN PATENT DOCUMENTS

| | | |
|---|---|---|
| 3521625 A1 | 12/1986 | Germany . |
| 3712492 A1 | 10/1987 | Germany . |
| 3632748 C2 | 4/1989 | Germany . |
| 3908418 A1 | 9/1990 | Germany . |
| 3147986 C3 | 2/1992 | Germany . |
| 3-107458 | 4/1991 | Japan . |
| 2053026 | 2/1981 | United Kingdom . |

*Primary Examiner*—Bernard Pianalto
*Attorney, Agent, or Firm*—Howson and Howson

[57] ABSTRACT

A method for producing at least a polymer surface layer on at least part of the inner surface of a hollow article that is at least partially of plastic, comprising coating said at least part of the inner surface of the hollow article by establishing a low pressure gas atmosphere within the hollow article, formin a polymerizable plasma within the article by excitation of the gas atmospher within the article by high-frequency electromagnetic energy, and allowing polymerization of the gas atmosphere to take place, whereby a polymerized coating is applied to said part of the inner surface, the gas atmospherre that forms the plasma containing a component that predominantly forms chains at sufficient speed and can be polymerized under the particular plasma conditions, and a component that forms predominantly branching or cross-linking points and can be polymerized under the particular plasma conditions.

37 Claims, 4 Drawing Sheets

METHOD FOR PRODUCING A POLYMER COATING INSIDE HOLLOW PLASTIC ARTICLES

The present invention relates to a procedure and a device for producing a polymer coating on at least one part of the inside surface of a hollow article that is at least in part of plastic, using low-pressure plasma polymerisation.

In a procedure of this kind, known from DE-PS 3,632,748, that is used to form diffusion-inhibiting coatings by means of plasma polymerisation of monomers that are not described in greater detail, plasma excitation is effected by way of externally coupled microwaves. A elastomer that is generated in this way is suitable for hollow articles that are of smaller volume. In the case of hollow articles that are of greater volume; unless additional measures are applied, however, plasma that is generated by means of microwaves is not uniform enough to form a coating that displays the required uniformity to the degree that is needed to produce a surface layer that is of greater area, such as is required, for example, for a vehicle fuel tank.

Elsewhere, it has been reported that a polymer coating applied by microwave plasma polymerisation of ethylene or ethylene/argon mixtures was applied to a vehicle tank and reduced the permeation of methanol-free test fuel through high-pressure polyethylene (HDPE) to approximately 2% of the original value. This led to the conclusion that an improvement can be achieved especially with plasma generation by microwave but not by alternating frequencies in the MHz range (R. Ludwig, *Plasmapolymerisation—Ein Verfahren zur Erzeuqung dünner Schichten,* Dissertation at RWTH, Aachen, 1989).

DE-OS 3,908,481 describes the plasma polymerisation of polar barrier coatings by using a plasma that is generated by a.c. voltages in the MHz range. It is a disadvantage that polar barrier coatings exert a repelling effect on non-polar components of fuels, but not with respect to methanol, so that the barrier effect that can be achieved is not sufficient in the case of fuels that contain methanol.

It is the task of the present invention to describe a method that permits the economical production of at least one large area polymer coating on a plastic substrate, in particular on a hollow plastic article, the surface layer displaying properties that are as uniform as possible despite its large area, and which thus provides an adequate barrier effect. This should also be so in the case of a charge that contains methanol, for example, fuels that contain methanol. The coating should ensure a barrier effect that satisfies today's and, optionally, future demands for the impermeability of hollow articles of this kind with respect to their contents. In addition, for reasons of economy, it should be possible to produce at least one coating in the shortest possible time.

In order to do this, it is possible to use compounds that form a polymer surface layer relatively quickly under plasma conditions as the components that form the coating. As an example, these include olefins, e.g. ethylene, extended cycloalkanes, e.g., cyclopropane, aromatics, heteroaromatics, e.g., pyrrol or thiophene; in general, however, as the speed with which the coating is formed increases, the degree of cross-linking decreases, which is to say that it is predominantly chains that are formed.

Since, generally speaking, the barrier effect decreases as the degree of cross-linking decreases, according to a proposal made by the present invention, in addition to the reaction gas that contains the component that predominantly forms chains, it can be advantageous to include a molecules that represent an additional component in the gas atmosphere that forms the plasma, and which under plasma conditions generate predominantly branching points in the polymer chains, in particular cross-linking points between the polymer chains. Highly unsaturated hydrocarbon compounds, e.g., acetylene or alkanes or compounds that form such highly saturated hydrocarbon compounds under plasma conditions, e.g., cyclobutene, have been shown to be particularly suitable for this purpose.

The components that form the branching or cross-linking points can be introduced into the gas atmosphere that forms the plasma in addition to the components that predominantly form chains. However, it is also possible to introduce both components that form the coating into the plasma as structural elements of the same molecule, the molecules of these starting substance being split under the conditions of the plasma into structures that form the two main components.

When this is done, the relationship between the two components, i.e., the components that predominantly form chains and the components that predominantly form branching or cross-linking points, are to be so selected that the coating that is formed from these components does not become noticeably brittle since this could mean that the coating displays essentially different characteristics with reference to it elastic deformability than the actual walls of the hollow article to which it is applied and which, since they are of thermoplastic material, can be elastically deformed relatively easily when subjected to mechanical loads. In the case of a coating that has been made very brittle because of cross-linking, there would be a danger that this coating would separate from the wall itself and/or form cracks under the action of mechanical loads and the deformation of the hollow article that results from such deformation. The optimal degree of cross-linking which, on the one hand, results in a coating with the desired impermeability in a short period of time and in which, on the other hand, brittleness does not lead to a noticeable change in the mechanical properties of this covering layer, can be established by means of simple tests.

Generally speaking, the speed with which the coating is formed depends on the quantity of polymerisable substances that are added to the plasma per unit time; as the quantity increases per unit time, so does the speed with which the coating is formed. At all events, generally speaking, specific limits will have to be observed otherwise a dust-like deposit can be formed on the surface of the substrate or on the coating that is being formed. The formation of dust particles of this kind can be attributed, in particular, to the fact that the components that form the coating "condense" from the gas or vapor phase into the liquid and, ultimately, into the solid phases before reaching the surface of the substrate or the coating that is being formed. The disadvantage in the formation of dust particles of this kind lies in the fact that they are deposited on the surface of the substrate or of the coating that is being formed with the result that no coating that is free of pores will be formed at these points and after subsequent removal of the dust particles from the surface at these points the coating will not have the required impermeability. In addition, the formation of dust within tanks, in particular fuel tanks, is generally considered to be undesirable.

Thus, under certain operating conditions, it can be useful to add a component that counters the formation of dust to the starting substance that is to be introduced into the plasma. When this is done, this can be an inert gases or vapors that dilute the reaction gas, so that the polymerisation in the gas phase is slowed down. However, this will only be useful if the speed with which the coating is formed, and which has an effect on the economy of the method process, is not restricted. Avoiding or at least reducing the formation of dust can also be achieved in that substances that form reactive particles, e.g., monoradicals, in the plasma, and which restrict the occurrence of large aggregates in the gas phase are added as dust preventers. Such substances that cut down the formation of dust act, essentially, in such a way that some of the valencies of the components that form the coating of saturated, so that the particles of these components are less reactive. This means that the polymerisation takes place mainly on the surface of the substrate or in the coating that is being formed so that polymerisation that is already occurring in the gas phase and which, in the final analysis, reduces the efficiency with which the coating is formed, apart from the possible formation of pores, is largely avoided.

Argon or helium can be used as inert dust preventers that reduce the concentration of the polymerizing particles. H2, CH4, N2, NH3, ethane, and other lower alkanes can be used to form the reactive particles, the reaction of which with the components that form the coating scarcely reduces the speed with which the surface layer is formed.

A radio frequency can be used as high-frequency electromagnetic energy to generate the plasma. This has the advantage that the energy required to generate the plasma is considerably less than in the case of plasma that is generated by microwave. Because of this, the plasma generated by radio frequency is not as "sharp," and this fact—regardless of the quantity of components that form the coating and which are added—leads to a slower progress of the reaction, with the consequence that the surface layer that is applied by plasma polymerisation is of a better quality than that achieved when microwaves are used, given otherwise identical conditions. A further advantage is the fact that in plasma that is generated by radio frequency, the negatively charged elementary particles, the electrons, have a greater range of movement, with the result that because of the formation of the outer zone of the plasma, brought about because of this, conditions are present for forming the surface layer by polymerisation; this is not the case when microwaves of used.

However, it is also possible to generate the plasma by using microwaves. In addition, it is also possible to generate the plasma within the hollow article by the simultaneous use of radio frequency and microwaves. When this is done, in addition to the advantages discussed above, when microwave are used to generate the plasma, the advantages obtained by using microwaves are also made available; this results, in particular, in a higher deposition rate from the plasma and thus in a shorter process time, i.e., in higher productivity, when this method is used.

In order to minimize the permeability of the surface layer with respect to alcohol, in particular methanol, the substances that form the surface layer should as far as possible be non-polar. To this end, essentially non-polar starting substances are used since these do not lose this property, even when they are polymerized, and thereby form a surface layer of at least predominantly non-polar substances. According to the present invention, these starting substances can, for example, be gaseous or vapor-forming carbon and silicon compounds that can be expected to form highly cross-linked polymer coatings, and lead to a barrier coating of extremely low permeability. Suitable non-polar starting substances are, for example, hydrocarbons or siloxanes.

BRIEF DESCRIPTION OF THE DRAWINGS

The present invention will be described in greater detail below on the basis of the embodiments shown in diagramatic form in the drawings appended hereto. These drawings show the following.

Figure 1:
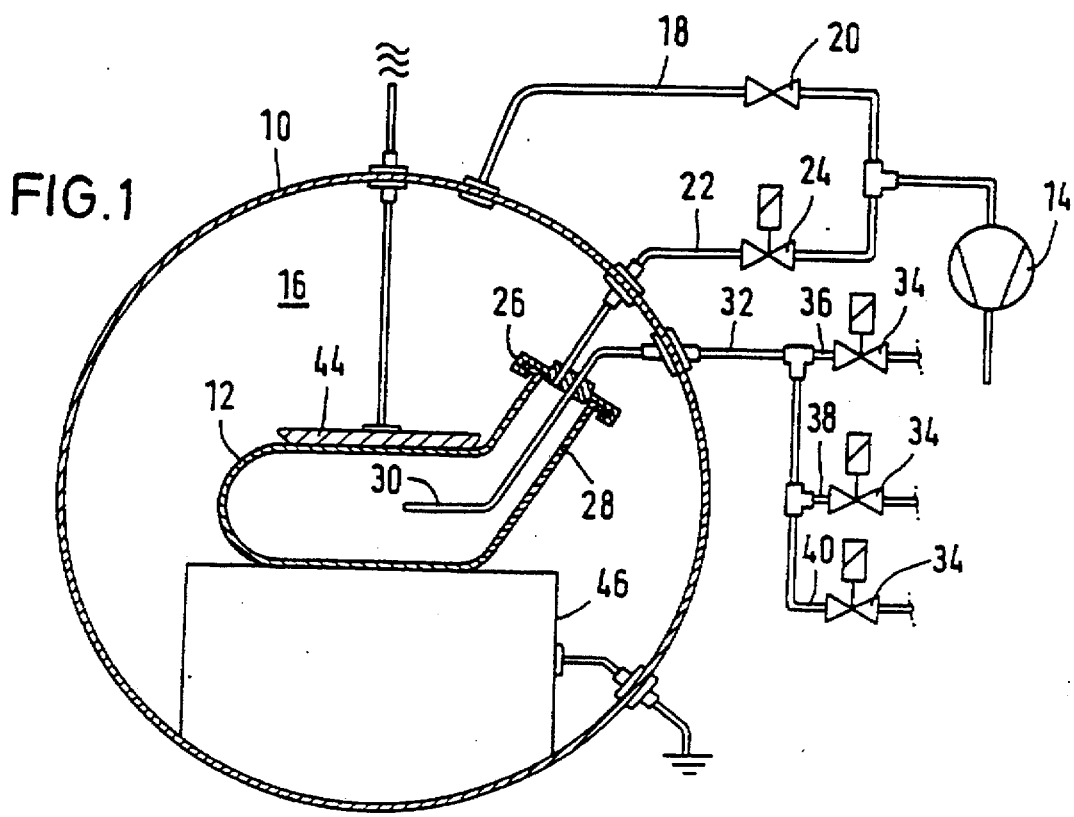
FIG. 1: a first embodiment of a device for applying a polymer coating to the inside surface of a hollow article that is of plastic, using radio frequency to generate the plasma.

The embodiment that is shown in FIG. 1 incorporates a vacuum chamber 10, within which fuel tanks that are of thermoplastic material are to be provided with an interior coating in the form of a polymer coating. Depending on the size of the particular tank 12 that is to be processed, the vacuum chamber can have a volume of 300 liters, for example. It is preferred that the vacuum chamber have a closable opening in one of its face sides, through which the particular tank 12 that is to be coated can be introduced into the vacuum chamber 10. The vacuum chamber is then closed, after which both the chamber and the tank 12 are evacuated by means of a vacuum-pump system 14. The connection between the vacuum pump system 14 and the interior space 16 of the vacuum chamber 10 is provided by way of a line 18 that incorporates a valve 20.

The interior of the tank 12 is connected to the vacuum pump system 14 by way of a line 22. The opening in the tank 12, through which evacuation is effected, is closed by means of a releasable quick coupling 26 in the form of a cap or the like, that is attached to the neck 28 by a bayonet connection. The line 22 for evacuating the tank 12 is connected tightly to an opening in this cap. Any other openings that are provided in the tank 12, which may be needed for its production, are closed off beforehand. However, it can also be useful to make such additional openings, which may be necessary, for example, when the tank is used, after the coating has been applied by means of plasma polymerisation.

A probe 30 is arranged within the tank 12 in the usual manner; this probe is used to introduce the starting substance (s) used to form the polymer surface layer. The probe 30 is similarly connected tightly to the cap or the like of the quick connector 26, which incorporates an additional opening for this purpose, to which a feed line 32 is connected. The feed line 32 is a collector line to which the lines 36, 38, and 40 are connected, each through its own associated shut-off valve, and each of these lines 36, 38, and 40 are connected to supply containers or the like (not shown herein) for at least one starting substances and, optionally, for other substance(s). Thus, for example, the starting substance for the components that predominantly form chains can be introduced through the line 36. The line 38 can be used to introduce the starting substance(s) for the components that predominantly form the branching or cross-linking points. The components that inhibit the formation of dust within the tank 12 can be introduced through the line 40.

Initially, the interior space of the vacuum chamber 10 and of the tank 12 are evacuated together. When a pressure of approximately 1000 Pa is reached, the valve 20 is closed so that the pressure within the space 16 does not fall below 1000 Pa. The interior of the tank 12 is then evacuated to a pressure of approximately 1 Pa. Then a gas mixture of, for example, 50% ethylene, 30% acetylene, and 20% methane is introduced into the tank 12 through the line 32. A pressure of 6 Pa is set up with the help of the choke valve 24, with the pump running. The throughput rates for the above gases amount, in each instance, to 25 or 15 or 10 cm3/minute, respectively, i.e., the major portion in the gas mixture falls to the components that predominantly form chains and the smallest falls to those components that inhibit the formation of dust.

Next, a surface electrode that is arranged within the vacuum chamber close to the tank 12 and above this, has a radio-frequency voltage of 13.56 MHz at a power of 10 Watts applied to it; this triggers a plasma within the tank 12, and this is maintained for approximately thirty minutes. No plasma is generated outside the tank 12 in the interior space 16, since the pressure within the interior space 16 is too high. In addition to this, the position of the electrode 44 inhibits any triggering of a plasma within the interior space 16. Within the vacuum chamber 10, the tank 12 lies upon a grounded base 46 that acts as the second electrode.

During the coating process, the plasma is observed with an optical sensor that detects the brightness of the plasma within the wave length range from 300 to 900 nm. Doing this serves, in particular, to keep the plasma constant in order to ensure the formation of an outer layer having reproducible properties.

Finally, the high-frequency voltage is switched off, the supply of gas is shut off, and [the vacuum chamber 16] is once again evacuated to 1 Pa. Once the evacuation has been concluded, the chamber 10 and the tank 12 are ventilated. The quick connector 26 and the probe 30 are removed. A dense coating that is 0.1 to 0.4 microns thick has been formed on the complete interior surface of the tank 12, and this reduces the permeability of the walls of the tank 12 with respect to a test fuel, consisting of 85% n-pentane and 15 percent methanol (according to ECE 34) to 0.4 g/d. The permeability of untreated tanks amounts to approximately 20 g/d.

Figure 2:
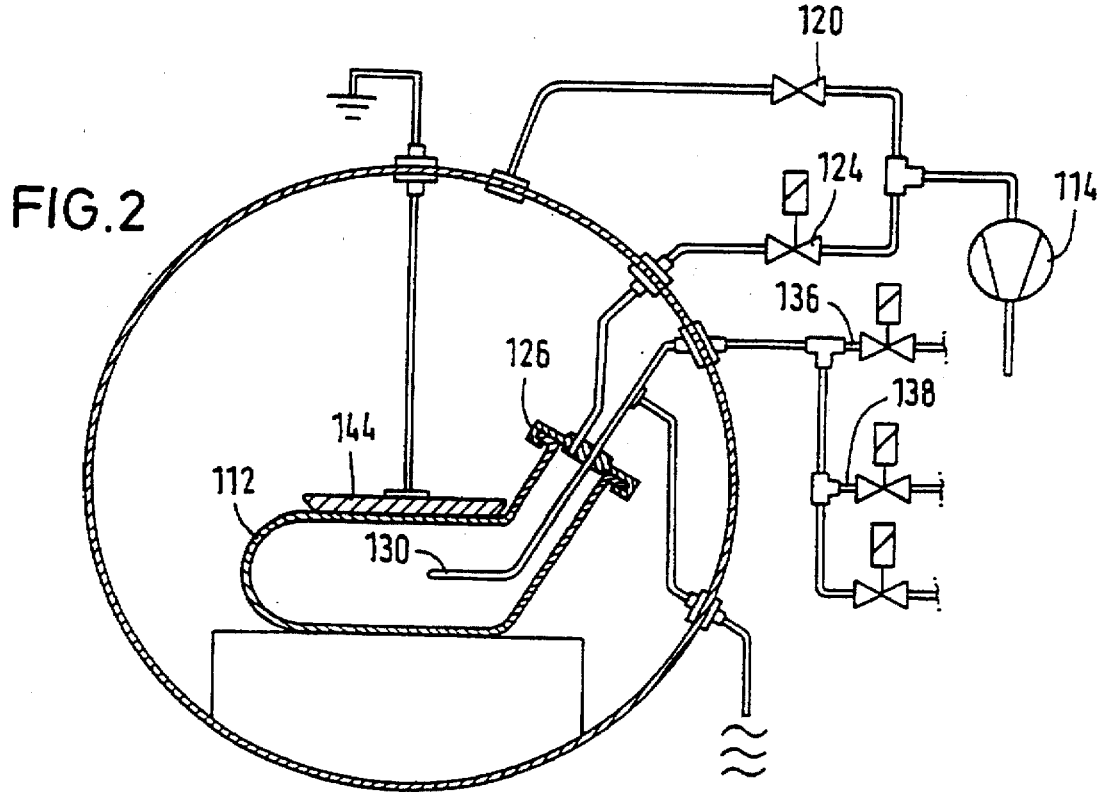
FIG. 2: a diagram of a second embodiment corresponding to FIG. 1.

The elements of the embodiment shown in FIG. 2 are essentially the same as those shown in FIG. 1, so that identical parts bear identical reference numbers, augmented by 100. The essential difference lies in the fact that in the device that is shown in FIG. 2, the probe 130 that is arranged within the tank 112 serves as an electrode to which an a.c. voltage of 125 KHz at a power of 150 Watts is applied. The surface electrode 144 that is also used in this embodiment is grounded. The stability of the plasma that is formed within the tank 112 is monitored using a special ion current or Langmuir probe that is attached to the probe 130. In this instance, the reaction gas consists of 50% ethylene and 50% acetylene. It was found that under these operating conditions it is possible to dispense with the supply of dust-inhibiting components, which is to say that in this instance, the starting substances are introduced only through the lines 136, 138.

In the embodiment shown in FIG. 3, once again the parts that corresponds to those in the embodiment shown in FIG. 1 bear identical reference numbers, augmented by 200. The essential advantage of the embodiment shown in FIG. 3 lies in the use of a vacuum chamber 210, the walls of which are largely adapted to the shape of the plastic tank 212 that is to be treated within the vacuum chamber, i.e., that the inner limits of the vacuum chamber 210 corresponds essentially to the outer limits of the tank 212. An essential advantage of this arrangement lies in the smaller volume of the interior space 216 of the vacuum chamber that is not filled by the tank 212, which means that the time required to evacuate this interior space 216 has been greatly reduced, and the transfer of the radio-frequency voltage into the interior of the tank 212 has been optimized. This leads to a notable reduction of the processing time required to apply a coating with specific properties in comparison to the embodiments shown in FIG. 1 and FIG. 2. Taken all in all, the amount of investment required for the device is also reduced.

In order to simplify operation of the device, the vacuum chamber 210 is divided into two approximately equal parts in such a way as to form a lower half 210a and an upper half 210b, the upper half 210b being formed as a cover that fits onto the lower stationery half 210a. The two parts 210a, 210b are insulated from each other with a seal 248 that is of elastic rubber material. When the chamber 210 is closed, this seal also acts to steal it off from the external atmosphere.

A line 218 for evacuating the vacuum chamber 210 runs from the vacuum-pump system 214. The other suction line 222 is so configured and arranged that a flange 250 that is formed at its end area and which is of a conical shape lies on the section of the chamber wall that defines an opening 254 in the vacuum chamber 210, with an interposed sealing ring 252, so that the opening 254 through the flange 250 of the suction line 222 is closed off. The opening of the tank 212 is closed by the cap of a quick connector 226 that incorporates an additional opening for the vacuum. However, the arrangement can also be such that the unattached end of the suction line 222 fits into the neck 228 of the tank 212 and seals this off to the outside. To this end, the suction line could incorporate a section of smaller diameter that projects beyond the flange 250 in the direction of the tank.

Here, too, a probe 230 is arranged within the tank 212 and the substances that are required to form the polymer surface layer and, optionally, the components that inhibit the formation of dust are introduced through this. In addition to this, the other devices for monitoring the plasma, etc., can also be associated with this probe. The suction line 222 and the probe 230 as well as other associated parts can be so arranged that when the tank 212 is installed in the vacuum chamber, the suction line 222 and the probe 230 with the associated parts must of necessity be in the correct position relative to the tank 212, in which good distribution of the substances that form the surface layer within the hollow article is achieved. When the vacuum chamber 210 is closed by the appropriate positioning of the upper half 210b, the vacuum chamber is finally sealed off from the external atmosphere and the the tank 212 that is located within the chamber 210 is sealed relative to the interior space 216 of the vacuum chamber.

Figure 3:
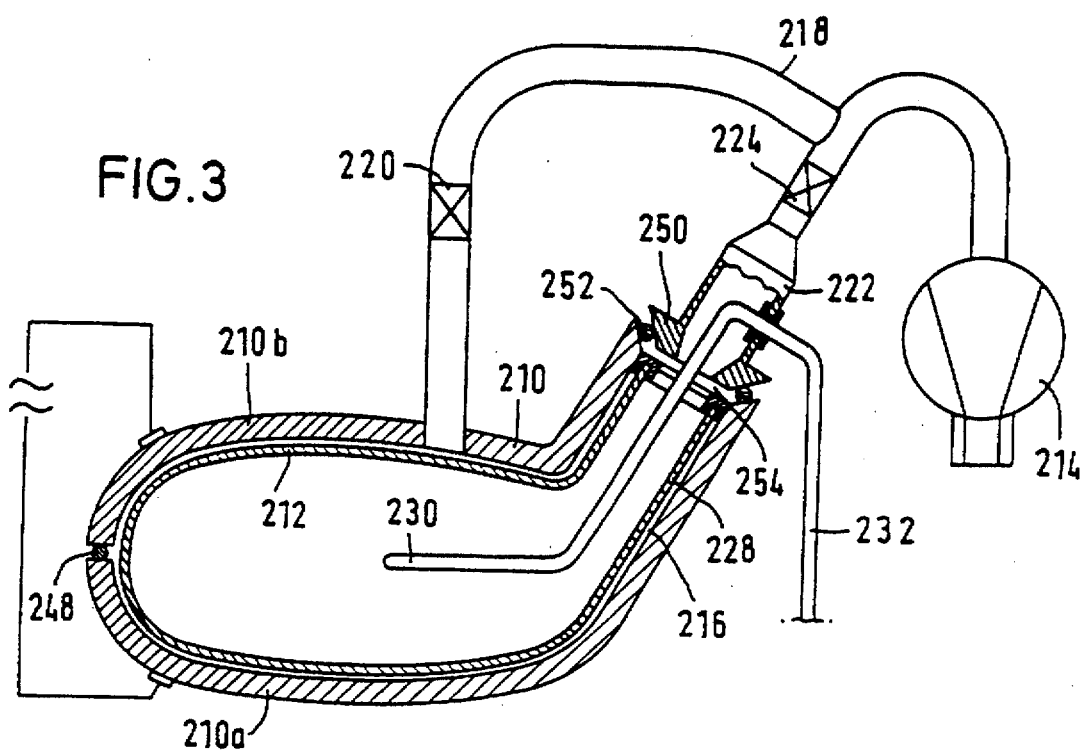
FIG. 3: a drawing of a third embodiment.

A radio frequency in the range from 30 to approximately 500 kHz or 6.78, 13.56, 27.12, or 40.68 MHz can be used to generate the plasma. FIG. 3 shows an embodiment in which the radio frequency is applied capacitatively to both parts 210a, 210b at no potential. However, it is also possible, analogously to the embodiment shown in FIG. 2, to use the probe 230 as an electrode, when both halves 210a, 210b are grounded. Another possibility is to apply the radio frequency to one of the two parts 210a; 210b, in each instance grounding the other half.

Figure 4:
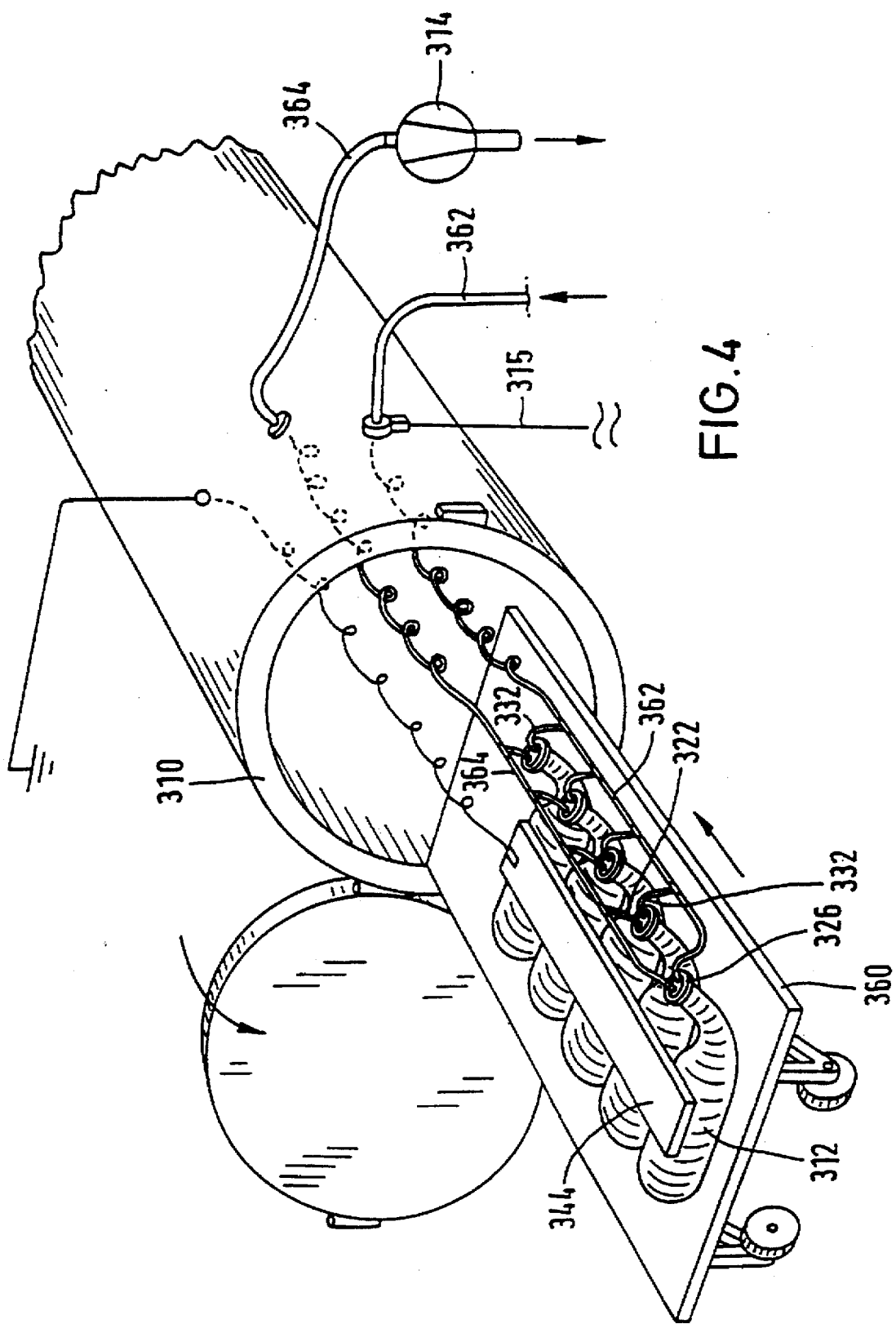
FIG. 4: a device for simultaneously processing a plurality of hollow articles.

The embodiment that is shown in FIG. 4, in which the parts that corresponds to the embodiment shown in FIG. 1 bear identical reference numbers, augmented by 300, is provided with a vacuum chamber 310 that is large enough to permit the simultaneous processing of a plurality of tanks 312, e.g., 10, that are arranged on a coating truck 360. As in the embodiment that is shown in FIG. 2, there is a surface electrode 344 that is arranged above the batch of all the tanks 312 and is appropriately dimensioned and grounded. A probe is introduced into each of the tanks 312. The individual tanks 312 are fitted with a quick connector 326, in a manner that has already been described in connection with FIGS. 1 and 2; this supports the probe and is simultaneously provided with an entry for the starting substance(s) for the polymer surface layer. The feed lines 332 for all of the tanks 312 are connected to a common supply line 362 that is once again connected in a suitable manner to supply containers for the individual components, as has already been described in connection with FIG. 1. In addition, the suction lines 322 for all of the tanks 312 are connected to a common central suction line 364. The a.c. voltage is applied to the probes 330 through the electric line 315. This a.c. voltage can be, for example, 13.56 Mhz.

The tanks 312 that are to be processed can be laid on the coating truck 360 outside the vacuum chamber 310, and this is then moved into the vacuum chamber 310. Then, the connections for the gas feed lines and the line used to evacuate the individual tanks 312 and for connecting the a.c. voltage are produced by way of a common quick connector for all the lines.

Figure 5:
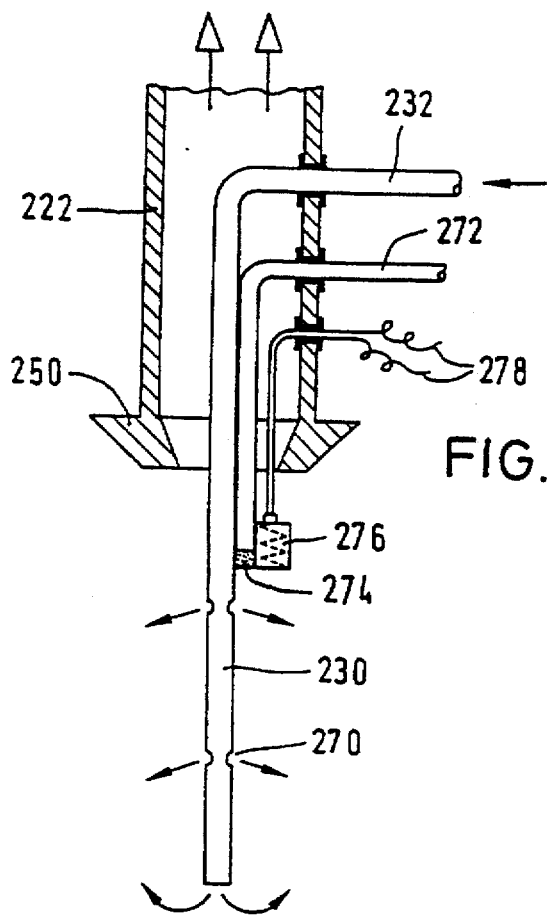
FIG. 5: a detail at greater scale.

FIG. 5 shows some individual details of a possible configuration of the suction line for the tank and the probe that is to be introduced into the tank, with additional parts and devices. In the following section, the reference numbers for the embodiment shown in FIG. 3 are used, even though the arrangement that is shown in FIG. 5 can be used in the other embodiments with very slight modifications. The feed line 232 is introduced into this through the wall of the suction pipe 222. It extends, after a right-angle curve, essentially coaxially through the suction pipe 222 towards the tank and continues into this as the probe 230. The probe incorporates bores 270 for the egress of the gas or vapor-form starting substance(s). In addition, a fiber optic line 272 is provided and this runs essentially parallel to the line 232 and ends close to the part where this makes the transition to become the probe 230, so that it is possible to observe the plasma in the tank when the parts are in the operating position. At this end, the fiber optic line 272 is closed off by a window 274 through which the plasma that is generated in the tank 212 can be observed. A resistance heater 276 is associated with the window 274 and this brings the window 274 to a temperature that prevents the deposition of a surface layer onto this window, so that it remains transparent. The electrical feed lines for the heater 276 are numbered 278.

In the case of the embodiment that is shown in FIG. 1 and FIG. 2, the suction pipe could end at the quick connector 26, 126, respectively, whereas the feed line 232 for the starting substance could pass through an opening in the cap or the like of the quick connector. The latter could also apply to the fibre optic line and the electrical feed lines for the resistance heater that is associated with the window.

Figure 6:
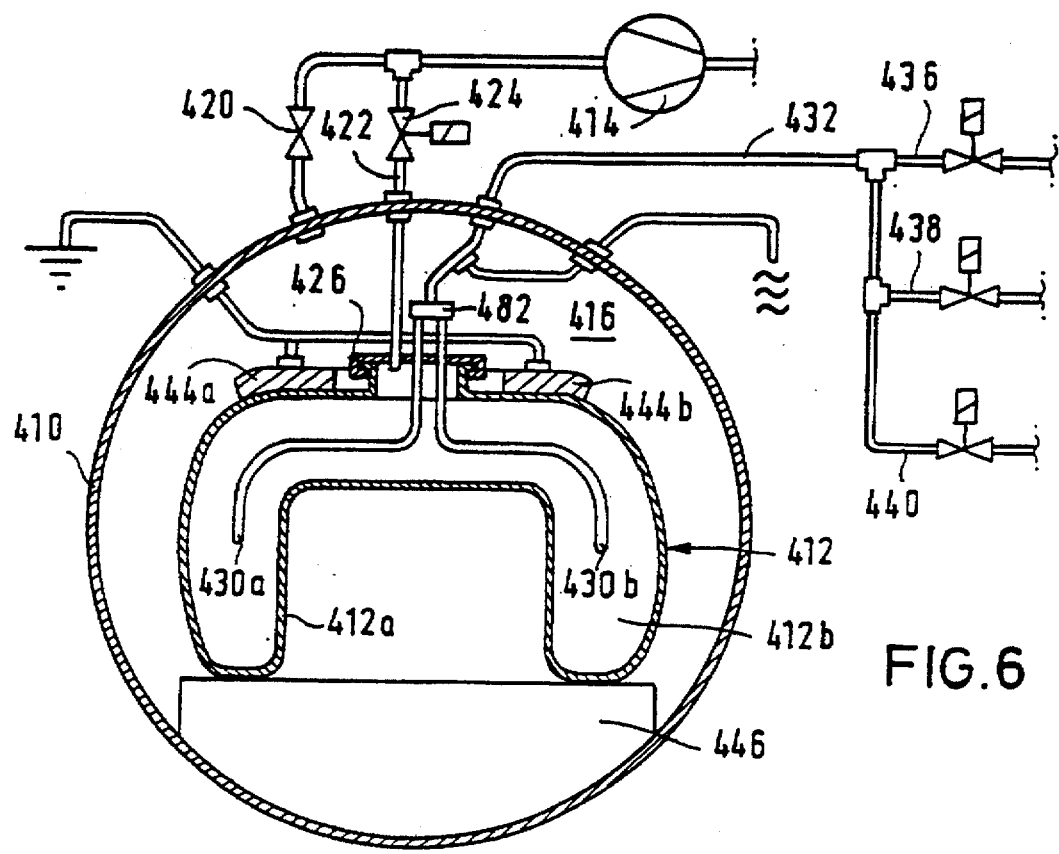
FIG. 6: a drawing of a third embodiment corresponding to FIG. 1.

In contrast to the embodiments that are shown in FIG. 1 to FIG. 4, it is also possible to have more than one probe within the hollow article. This is particularly useful if the hollow article is of a shape that renders it difficult to achieve uniform distribution of the substances that form the outer layer when only one probe is used. An embodiment of this kind is shown in FIG. 6, wherein the fundamental construction of this embodiment agrees with that shown in FIG. 2, so that identical parts bear identical reference numbers, which are augmented by 300. Parts that corresponds to those in FIG. 1 are augmented by 400.

The essential difference according to the embodiment shown in FIG. 2 is that, because of the shape of the tank 412 (side tank), which is approximately U-shaped, two probes 430a and 430b are used, and these both serve as electrodes to which an a.c. current of, for sample, 125 kHz is applied at a power of, for example, 150 Watts. The surface electrode that is also used, and which is arranged outside the tank 412, is divided into two areas 444a and 444b in such a manner that one of the two probes 430a or 430b is associated with each of these two areas. Because of the fact that the tank 412 is configured so as to be fairly symmetrical, the two probes are also arranged in an appropriate manner. However, it is quite possible, in the case of an irregularly shaped tank, to arrange the probes assymetrically, so as to match the particular shape of the tank. It is also possible to have an embodiment in which more than two probes are used. In any case, what is in important is to create the required conditions, such that the most uniform plasma possible is generated across the whole interior space of the tank; and that the most uniform possible distribution of the substances from which the outer layer is produced, is ensured. Unlike the version shown in FIG. 6, it is also possible-in the event that more than one probe is used-to use these probes only to introduce the substance(s) used to form the surface layer and to provide at least one second electrode outside the tank, as is shown by way of an example in the embodiment shown in FIG. 1.

In the embodiment that is shown in FIG. 6, the two probes 430a and 430b are connected to the feed line 432 through a connector 482. When this is done, the two probes 430a and 430b are introduced into the tank through the same opening in the tank 412 that is closed off by the cap 426. Of course, it is also possible to introduce the two probes through different openings in the tank into its interior. This will also have to be taken into consideration if there is more than one opening in the tank and the tank is of such an irregular shape that the introduction of the probes through different openings—which consequently have to be made in different areas of the tank wall—simplifies the optimal arrangement of the probes within the tank. In general, it will be a matter of arranging the probes in areas of the interior space that are connected only by intermediate areas of small cross-sectional dimensions. For the remainder, it is also possible to configure one of the probes only as an electrode. How this is done will depend on the circumstances surrounding each individual case. In general, if the starting substance(s) is introduced through a plurality of probes, this will contribute to the uniformity of the plasma and thus to the uniformity of the surface layer that is to be produced. Of course, if there are more than one opening in the tank, care will have to be taken that all the openings are closed off in order to create those conditions within the hollow article that are necessary for generating the plasma.

Figure 7:
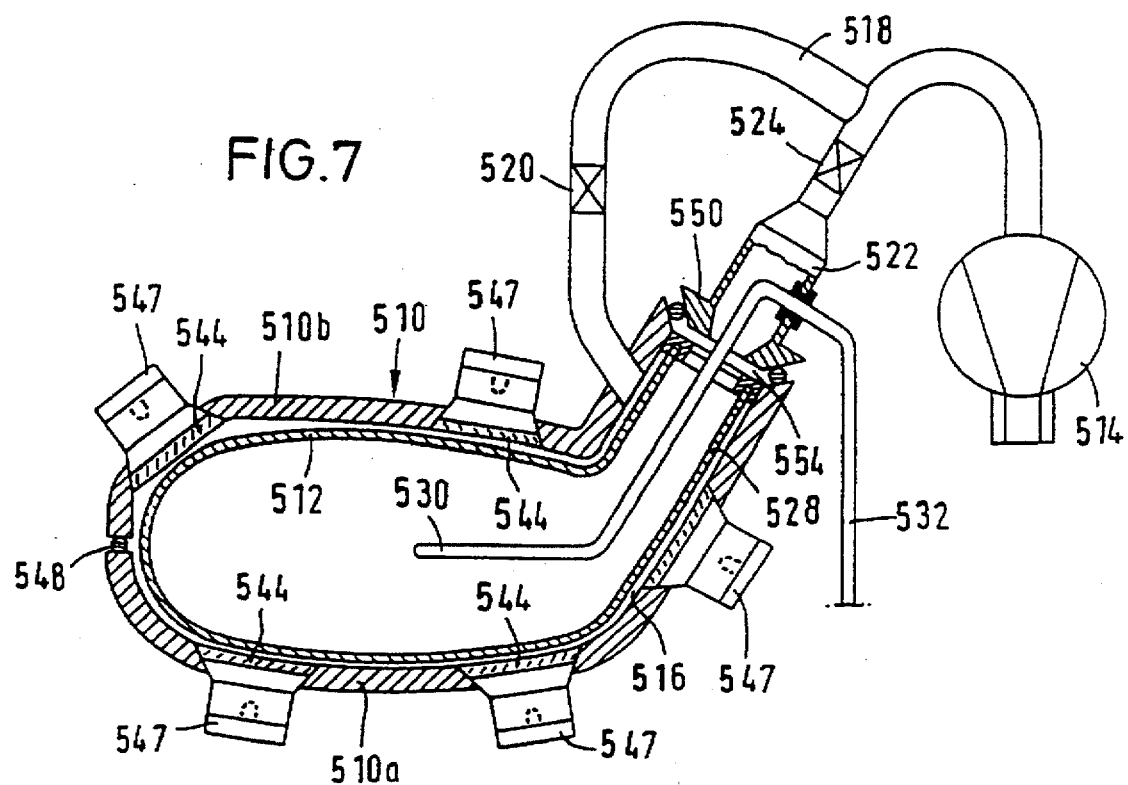
FIG. 7: a fourth embodiment in which the plasma is generated by using microwaves.

The embodiment that is shown in FIG. 7 uses essentially the same parts that are used and shown in FIG. 3, so that the parts that correspond to those in FIG. 3 bear the same reference numbers, augmented by 300. The essential difference is that in the embodiment shown in FIG. 7, the plasma is generated by microwaves; here, too, the walls of the vacuum chamber 510 are largely matched to the shape of the plastic tank 512 that is to be processed. This not only brings about a considerable reduction in the amount of time that is required to evacuate the interior space 516; such a configuration also optimzes the coupling of the microwaves into the interior of the tank 512. This leads to a notable reduction in the processing time that is required to apply a coating with specific properties, as compared, for example, to a vacuum chamber with a shape such as is shown in FIG. 1.

The wall of the vacuum chamber 510 incorporates microwave windows 544 that are of quartz glass, through which the microwaves are in each instance applied from a microwave generator 547 that is located outside the vacuum chamber 510. In contrast to the configuration that is shown in FIG. 7, in which each microwave window 544 has its own associated microwave generator 547, it is also possible to use only one microwave generator for the vacuum chamber 510; if this is done, the microwaves are conducted to the individual microwave windows by way of a suitable distributor and by way of suitable lines. In this instance, too, the probe 530 that is arranged inside the tank 512 can be used to introduce the substances that are required to form the polymer surface layer and, optionally, for the components that inhibit the formation of dust, and for devices for monitoring the plasma, etc.

We claim:

1. A method for producing at least a polymer surface layer on at least part of the inner surface of a hollow article that is at least partially of plastic, comprising coating said at least part of the inner surface of the hollow article by establishing a low pressure gas atmosphere within the hollow article, forming a polymerizable plasma within the article by excitation of the gas atmosphere within the article by high-frequency electromagnetic energy, and allowing polymerization of the gas atmosphere to take place, whereby a polymerized coating is applied to said part of the inner surface, the gas atmosphere that forms the plasma containing a component that predominantly forms chains at sufficient speed and can be polymerized under the particular plasma conditions, and a component that forms predominantly branching or cross-linking points and can be polymerized under the particular plasma conditions.

2. A method as defined in claim 1 in which the throughput rate of all the effective components of the gas atmosphere that forms the plasma amounts to 10 cm$^3$/minute to 150 cm$^3$/minute.

3. A method as defined in claim 1, in which a plurality of hollow articles are processed simultaneously within a vacuum chamber.

4. A method as defined in claim 1, in which a siloxane, e.g., hexamethyldisiloxane, a silazane, e.g., hexamethyldisilizane, or an organically substituted silane, preferably an alkenyl or alkoxy silane, e.g., vinyltrimethylsilane, or triethoxyvinylsilane is used for the substance that forms both the component that forms chains and that are cross-linking.

5. A method as defined in claim 1, in which at least two of the components are introduced into the hollow article as gases and/or vapors that differ from each other.

6. A method as defined in claim 1, in which at least two of the components are introduced into the plasma as structural elements of the same molecule.

7. A method as defined in claim 6, in which a substance that predominantly forms chains is introduced into the plasma, and a part of this is split in the plasma and converted to a component that predominantly forms branching and cross-linking points.

8. A method as defined in claim 1, in which the gas atmosphere that forms the plasma contains at least one non-polar starting substance that is in gaseous and/or vapour form.

9. A procedure as defined in claim 1, in which the cross-linking of the substances that form the polymer surface layer is only effected to an extent at which the surface layer undergoes no embrittlement, such as would lead to it parting from the inner surface of the hollow article that is essentially elastically deformable.

10. A method as defined in claim 1, in which the area of the substrate that is to be provided with at least a surface layer is subjected to pre-treatment and/or secondary treatment with a plasma that does not form a coating.

11. A method as defined in claim 1, in which the application of at least one surface layer on the inside surface of the container is effected within a vacuum chamber.

12. A method as defined in claim 11, in which the pressure within the hollow article is 1–150 Pa.

13. A method as defined in claim 12, in which the pressure within the hollow article is 3–20 Pa.

14. A method as defined in claim 11, in which the pressure outside the hollow article within the vacuum chamber is so selected that the occurrence of plasma is precluded.

15. A method as defined in claim 14, in which the pressure outside the hollow body within the vacuum chamber is higher than the pressure within the hollow article and is so selected that any impermissible deformation of the hollow article caused by the pressure differential is avoided.

16. A method as defined in claim 15, in which the pressure within the vacuum chamber, outside the hollow article that is located therein, is greater than 5 mbar.

17. A method as defined in claim 1, in which the plasma within the hollow article is generated with a radio frequency of 30 kHz to 100 Mhz.

18. A method as defined in claim 1, in which the radio frequency-power density is 0.25 to 20 W/dm$^3$, preferably 0.5 to 10 W/dm$^3$ of the volume within the hollow article.

19. A method as defined in claim 1, in which, in order to generate plasma within the hollow article, microwaves are coupled into the vacuum chamber and the hollow article that is located therein through at least one window in the wall of the vacuum chamber.

20. A method as defined in claim 19, in which the microwaves are dispersed within the chamber in order to ensure that they are evenly distributed.

21. A method as defined in claim 19, in which the microwaves used to generate the plasma within the hollow article are coupled into the vacuum chamber by a microwave rod antenna.

22. A method as defined in claim 21, in which the microwaves used to generate the plasma within the hollow article are coupled directly into the interior of the hollow article that is located within the vacuum chamber.

23. A method as defined in claim 19, in which the microwaves used to generate the plasma within the hollow article are coupled into the vacuum chamber by way of a slot antenna.

24. A method as defined in claim 19, in which the plasma that is generated by microwaves within the hollow article is affected by magnets that are arranged within and/or outside the hollow article.

25. A method as defined in claim 19, in which the microwave-power density is 0.25 to 50 W/dm$^3$, preferably 0.5 to 20 W/dm$^3$ volume within the hollow article.

26. A method as defined in claim 19, in which the plasma within the hollow article is generated by the simultaneous application of both radio frequency and microwaves.

27. A method as defined in claim 1 in which the throughput rate of all the effective components of the gas atmosphere that forms the plasma amounts to 5 cm$^3$/minute to 1000 cm$^3$/minute.

28. A method as defined in claim 1, in which the component that predominantly forms chains consist of at least one compound that polymerizes easily under plasma conditions, e.g., a monoolefin, cycloalkane, nitrile, aromatic or heteroaromatic, preferably ethylene, propane, butane, isobutene, cyclopropane, pyrrol, or thiophene.

29. A method as defined in claim 1, in which a highly unsaturated carbon compound, e.g., a diolefin, preferably butadiene, or isoprene, an alkenine, e.g., vinylacetylene, an alkenyl aromatic, in particular styrene, and an alkenyl aromatic or an alkenyl nitrile, e.g., acrylnitrile, is used as the component that is predominantly cross-linking.

30. A method as defined in claim 1, in which the gas atmosphere that forms the plasma contains a component that counters the formation of dust.

31. A method as defined in claim 30, in which inert gases or vapors are added to the plasma as the component that counters the formation of dust.

32. A method as defined in claim 30, in which substances that form reactive particles in the plasma, e.g., monoradicals that inhibit the formation of large aggregates in the gas phase, are added as the component that counters the formation of dust.

33. A method as defined in claim 30, in which the component that is predominantly cross linking consists of a compound with at least one C≡C-triple bond, preferably acetylene or with accumulated C=C double bonds, preferably allene.

34. A method as defined in claim 30, in which a noble gas, preferably argon, is used as the component that prevents dust.

35. A method as defined in claim 30 in which a compound that forms monoradicals in the plasma is used as the component that prevents dust.

36. A method as defined in claim 30 in which a compound that forms monoradicals in the plasma is used as the component that prevents dust, the monoradical-forming compound being taken from the group consisting $H_2$, $N_2$, $NH_3$ and lower alkanes.

37. A method as defined in claim 30 in which a compound that forms monoradicals in the plasma is used as the component that prevents dust, the monoradical-forming compound being taken from the group consisting $H_2$, $N_2$, $NH_3$ and $CH_4$.

* * * * *

UNITED STATES PATENT AND TRADEMARK OFFICE
CERTIFICATE OF CORRECTION

PATENT NO. : 5,677,010
DATED : October 14, 1997
INVENTOR(S) : Esser et al.

It is certified that error appears in the above-indentified patent and that said Letters Patent is hereby corrected as shown below:

```
On the cover page, item [73] Assignee:
after "Germany" insert --Buck Werke GMBH & Co.,
Bad Uberkingen, Fed Rep Germany--;

In line 7 of the abstract, change "atmospher" to
--atmosphere--.
```

Signed and Sealed this

Third Day of March, 1998

Attest:

BRUCE LEHMAN

*Attesting Officer*   *Commissioner of Patents and Trademarks*